US010976834B1

(12) United States Patent
Wang

(10) Patent No.: US 10,976,834 B1
(45) Date of Patent: Apr. 13, 2021

(54) LIGHT INTEGRATED SENSING MEMBRANE

(71) Applicant: Apple Inc., Cupertino, CA (US)

(72) Inventor: Paul X. Wang, Cupertino, CA (US)

(73) Assignee: APPLE INC., Cupertino, CA (US)

(*) Notice: Subject to any disclaimer, the term of this patent is extended or adjusted under 35 U.S.C. 154(b) by 0 days.

(21) Appl. No.: 16/595,930

(22) Filed: Oct. 8, 2019

Related U.S. Application Data

(63) Continuation of application No. 15/839,548, filed on Dec. 12, 2017, now Pat. No. 10,444,856.

(60) Provisional application No. 62/516,608, filed on Jun. 7, 2017.

(51) Int. Cl.
G06F 3/02 (2006.01)
G06F 3/023 (2006.01)
H01H 13/703 (2006.01)
H03K 17/955 (2006.01)
H03K 17/98 (2006.01)

(52) U.S. Cl.
CPC .......... G06F 3/0221 (2013.01); G06F 3/0216 (2013.01); G06F 3/0233 (2013.01); H01H 13/703 (2013.01); H03K 17/955 (2013.01); H03K 17/98 (2013.01); H03K 2217/9653 (2013.01)

(58) Field of Classification Search
CPC .. H01H 13/7065; H01H 13/88; H01H 13/023; H01H 13/703; H01H 2221/04; H01H 3/125; H01H 2209/064; H01H 2219/036; H01H 2219/062; H01H 2227/01; H01H 2229/028; H01H 2211/004; H03K 17/98; H03K 17/955; H03K 17/9653; Y10T 29/49002; Y10T 29/49105; G06F 3/0221; G06F 3/0216; G06F 3/0233
See application file for complete search history.

(56) References Cited

U.S. PATENT DOCUMENTS

| | | | |
|---|---|---|---|
| 4,349,712 A * | 9/1982 | Michalski | H01H 13/702 200/5 A |
| 5,220,318 A | 6/1993 | Staley et al. | |
| 6,962,452 B2 | 11/2005 | Cheng | |
| 7,667,623 B2 | 2/2010 | Soh et al. | |
| 8,217,285 B2 | 7/2012 | Chang | |
| 8,232,494 B2 | 7/2012 | Purcocks | |
| 2010/0314226 A1 * | 12/2010 | Patel | H01H 9/168 200/237 |
| 2013/0162450 A1 | 6/2013 | Leong et al. | |
| 2014/0176159 A1 * | 6/2014 | Pintiliuc | H03K 17/965 324/655 |

(Continued)

Primary Examiner — Christopher E Leiby
(74) Attorney, Agent, or Firm — Dorsey & Whitney LLP

(57) ABSTRACT

Embodiments are directed to a sensing membrane that is coupled with electrical terminals of a key switch and a light source. This may allow the membrane to be both configured to transmit a signal in response to actuation of keyboard key cap and illuminate an illuminable symbol of key cap. In one aspect, the membrane includes a set of deformable layers separated by a spacer layer. Terminals of the key switch are connected to distinct ones of the set of deformable layers and positioned within a cavity defined by the spacer layer. A light assembly may be positioned along and configured to move with one of the set of deformable layers. Depression of a key cap toward the set of deformable layers causes the set of terminals to move and initiate a switch event.

18 Claims, 14 Drawing Sheets

(56) References Cited

U.S. PATENT DOCUMENTS

2016/0327986 A1 11/2016 Farahani et al.
2018/0330899 A1* 11/2018 Chen .................... H03K 17/969

* cited by examiner

LIGHT INTEGRATED SENSING MEMBRANE

CROSS-REFERENCE TO RELATED APPLICATION(S)

The present application is a continuation of U.S. patent application Ser. No. 15/839,548, filed Dec. 12, 2017, and titled "Light Integrated Sensing Membrane," which claims the benefit of U.S. Provisional Patent Application No. 62/516,608, filed Jun. 7, 2017 and titled "Light Integrated Sensing Membrane," the disclosures of which are hereby incorporated herein by reference in their entireties.

FIELD

The described embodiments relate generally to input devices for computing systems. More particularly, the present embodiments relate to structures that facilitate illumination of a keyboard.

BACKGROUND

In computing systems, a keyboard may be employed to receive input from a user. Many traditional keyboards may suffer from significant drawbacks that may affect the visibility of keyboard keys in a dimly-lit environment. In many cases, traditional keyboards include various mechanical and electrical components that may impede illumination of the keyboard.

SUMMARY

Embodiments of the present invention are directed to a light integrated sensing membrane. The light integrated sensing membrane may include a light source and electrical terminals of a key switch, each coupled to a common deformable layer.

One embodiment may take the form of a keyboard, comprising: a key cap; a tactile dome below the key cap; a deformable layer positioned below the tactile dome; an electrical terminal of a key switch positioned on the deformable layer; and a light assembly having a light source; electrical traces positioned on the deformable layer, coupled to the light source, and configured to deform with the deformable layer; wherein: the tactile dome is configured to collapse and electrically couple the electrical terminal with another element of the keyboard.

Another embodiment takes the form of a keyboard, comprising: a key cap; a set of deformable layers positioned below the key cap; a spacer layer separating the set of deformable layers; a set of electrical terminals, each of the set of electrical terminals connected to a distinct one of the set of deformable layers; and a light assembly positioned on, and configured to move with, one of the set of deformable layers, wherein: the key cap is configured to depress; and the set of electrical terminals is configured to move and initiate a switch event in response to depression of the key cap.

Still another embodiment takes the form of an electronic device, comprising: a deformable layer; a spacer layer adjacent the deformable layer and defining a cavity; a tactile dome positioned above both the deformable layer and the spacer layer; an electrical terminal connected to the deformable layer and operable to initiate an electrical response in response to buckling of the tactile dome; and a light assembly having a light source at least partially positioned within the deformable layer or the spacer layer, wherein: at least one of the deformable layer or the spacer layer defines a light guide configured to redirect light from the light source to an illuminable symbol positioned above the tactile dome; and the deformable layer is configured to deform into the cavity.

In addition to the sample aspects and embodiments described above, further aspects and embodiment will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like elements.

Figure 1:
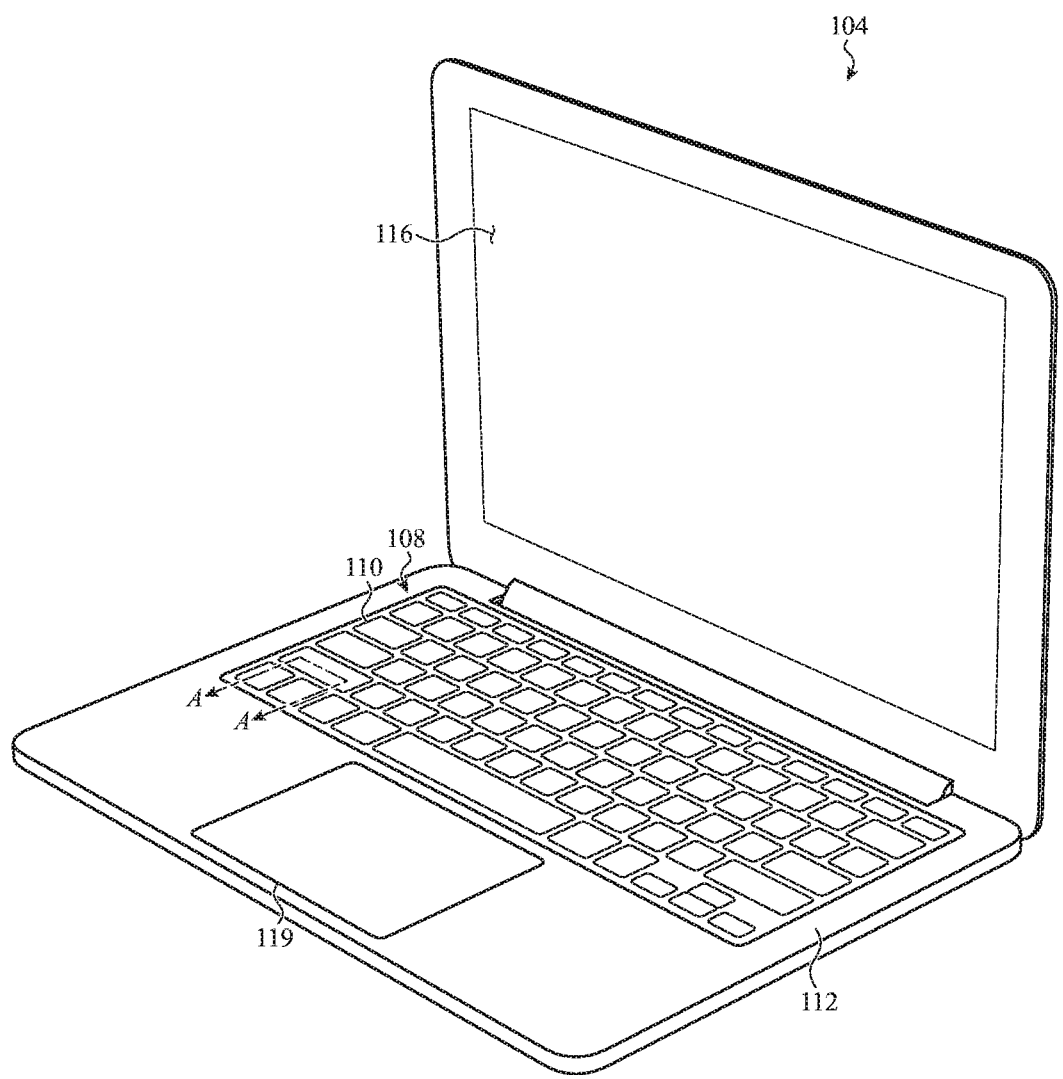
FIG. 1 depicts a sample electronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

The description that follows includes sample systems, methods, and apparatuses that embody various elements of the present disclosure. However, it should be understood that the described disclosure may be practiced in a variety of forms in addition to those described herein.

The present disclosure describes systems, devices, and techniques related to a key assembly or other input mechanism for an input device, such as a keyboard. More particularly, the disclosure describes various illumination structures that may illuminate one or more key caps of a keyboard (or input surfaces of another input mechanism). An illumination structure may include a light integrated sensing membrane, or other translucent or light-transmissible structure or portion of the key assembly that includes electrical terminals of a key switch. A light source, such as a micro light emitting diode (mLED), may be positioned on, within, or partially surrounded by, one or more translucent and deformable layers of the membrane that may be coupled with the mLED and include electrical terminals of a key switch (e.g., the electrical terminals of the key switch may be positioned on, or in, the deformable layers). This may allow the light integrated sensing membrane to be configured to both transmit a signal in response to actuation of the keyboard key (via the electrical traces of the key switch) and illuminate an illuminable symbol of the key cap using a common or integrally formed deformable layer, as described herein. For example, a tactile dome positioned below the key cap and above the light integrated sensing membrane may collapse in response to an input and cause an electrical connection between the electrical terminals, thereby initiating a switch event. The electrical terminals may transmit this signal to a processing unit or other element of an electronic device, thereby registering the input as an input to the electronic device.

To facilitate the foregoing, the light source, such as the mLED, may be connected to, and/or partially surrounded by, one or more of the translucent deformable layers of the light integrated sensing membrane. Further, one or more of the translucent deformable layers may define or include signal-transmitting or initiating electrical terminals positioned thereon, or these terminals may be positioned on a surface of the layer. The electrical terminals may initiate an electrical response when connected that may trigger a switch event. By integrating the light source with the deformable layers as described herein, the overall size and/or thickness of the stack-up for the key assembly, or other input mechanism, may be reduced. Further, this may allow a surface area of the light integrated sensing membrane to be increased, which may enhance the ability to route switch circuitry (such as a key switch) and/or other electrical components in or over the light integrated sensing membrane.

The light integrated sensing membrane may include a light assembly having a light source coupled with electrical traces positioned on a deformable layer. As described herein, the deformable layer may also be used to trigger a switch event in response to a force input. In this regard, rather than provide a separate carrier or substrate for the light assembly, a deformable layer of the light integrated sensing membrane may be used to secure the light assembly within the key assembly. The light assembly may also include an optical layer, such as a phosphor layer, and/or a protective coating that may partially or fully encapsulate the light source or other component of the deformable layer. In one embodiment, the optical layer may be a phosphor layer and/or other light transmissible layer that may help control an optical characteristic of light emitted from the light source, such as a color, brightness, sharpness, and/or direction of the emitted light. The protective coating may be a translucent layer that is positioned over the light source and/or optical layer and configured to form a protective barrier between the light source and an environment of the key assembly. The protective layer may, in some cases, define a light guide coupled with light extraction features configured to expel light toward the key cap.

The light assembly may be coupled with one or two deformable layers of the light integrated sensing membrane. Broadly, the light integrated sensing membrane may include two (or more) such deformable layers that are configured to move toward one another in response to a force input received at the key cap, insofar as the deformable layers are positioned below the tactile dome, which is in turn positioned below the key cap. Thus, an input force on the key cap causes the key cap to translate, thereby buckling the tactile dome positioned below the key cap, and in turn moving at least one the deformable layers positioned below the tactile dome closer another deformable layer.

The two deformable layers may each support, be coupled with, or integrate electrical terminals or another element of a key switch and may be separated by a spacer layer separating the deformable layers and thus defining a cavity between the deformable layers. Electrical terminals of the key switch may be positioned on distinct ones of the first and second deformable layers and within the cavity. The first deformable layer may collapse, deform, or extend into the cavity and toward the second deformable layer under force, such that the electrical terminals of the key switch electrically couple to one another and trigger a corresponding switch event. For example, a tactile dome positioned below the key cap and above both of the deformable layers (e.g., such that the deformable layers are positioned below the tactile dome and the key cap) may be configured to collapse or buckle in response to an applied force from the key cap. The buckling of the tactile dome may cause a contact feature positioned on an underside of the tactile dome to contact and press into the first deformable layer positioned below the tactile dome. This may electrically couple an electrical terminal on the first deformable layer with another element, such as a second terminal, an electrical trace, an electrode, or the like. Such electrical coupling may initiate or terminate a signal, for example.

The light assembly, including the mLED, may be positioned along and/or within or partially within the first or second deformable layers in any appropriate configuration to illuminate a tactile dome and associated key or key cap positioned above the light integrated sensing membrane and tactile dome. In one embodiment, the light assembly may be positioned along or on the first deformable layer that includes, or is coupled with, at least a first of the electrical terminals of the key switch. The light assembly may be a top firing mLED positioned along a top surface of the first deformable layer and below the tactile dome, insofar as the deformable layer is positioned below the tactile dome. The top firing mLED may propagate light toward the tactile dome and cause illumination of the key cap positioned above the tactile dome. In this regard, the tactile dome may be a translucent or light transmissible structure (or have one or more translucent portions) that may allow light to pass therethrough. In some embodiments the light assembly may be arranged in various other configurations on or along the first deformable layer, including having a micro LED (mLED), or other suitable LED, positioned on or below a bottom surface of the first deformable layer. Additionally or alternatively, the light assembly may include a mLED within a recess or pocket or encapsulated by the first deformable layer. This may allow the first deformable layer to partially or fully surround the mLED or other light source, which may aid in using the first deformable layer as a light guide and help reduce a z-profile of the stack-up.

In another embodiment, the light assembly may be positioned along and/or partially or fully within the second deformable layer. A second of the electrical terminals of the key switch may be positioned on the second deformable layer. The light assembly may include a reverse firing mLED positioned on a bottom surface of the second deformable layer. In this regard, the light assembly and associated mLED may extend below the light integrated sensing membrane. As one example, the light source may extend below the light integrated sensing membrane and at least partially into a relief defined by a feature plate positioned below the light integrated sensing membrane. Generally, the relief may allow the light integrated sensing membrane to bend or bow into a region of the key assembly defined by the feature plate in response to a key press, which may help deliver a desired tactile response to a key cap of the key assembly. The relief may also surround at least some of the light assembly (e.g., the light source) to help improve the z-profile of the key assembly. In other embodiments, the light assembly may be positioned along a top surface of the second deformable layer, for example, such that the mLED of the light assembly is positioned with the cavity of the light integrated sensing membrane substantially between the electrical contacts that define the key switch. Additionally or alternatively, the light assembly may be positioned within a recess or pocket of the second deformable layer, which may allow the second deformable layer to be used as a light guide and may help improve the z-profile of the stack-up.

The light assembly may be configured to bend or deform with the deformable layers of the light integrated sensing membrane during actuation of the key assembly. For example, the light source, optical layer, protective coating, and/or electrical traces of the light assembly may be at least partially pliable or bendable in response to movements or bending of one or both of the deformable layers of the light integrated sensing membrane. In this regard, the mLED or other light source may be pressed or translated downward within the key assembly in response to a collapsing or buckling of the tactile dome caused by a depression of a key cap positioned above the tactile dome. This may allow the light source (with associated electrical traces) and the electrical traces of the key switch to be positioned on the same or common deformable layer, thereby potentially reducing or eliminating redundant components that may be used or otherwise required when a light source and a sensing membrane are isolated or separated components of a keyboard.

The light assembly may also be configured to direct or couple light directly into the tactile dome, which is positioned below a key cap. This may allow the tactile dome to be used as a light pipe or light conduit to propagate light between the light source and the key cap positioned above the tactile dome. In one configuration, the light assembly may include a mLED positioned directly below a contact feature or nub on the tactile dome. When the tactile dome is depressed, the contact feature may contact and partially conform or surround the mLED. As such, the contact feature and, more generally, a body of the tactile dome may function as a light guide that receives light from the light source and propagates the received light toward a key cap positioned along a top surface of the tactile dome.

In other cases, the light source may be positioned along a periphery of the tactile dome, for example, and extend partially or fully into a base of the tactile dome. For example, the tactile dome may include a recess or compartment along a periphery of the tactile dome that may be configured to receive the mLED or other light source of the light assembly with or about the base of the tactile dome. In some cases, the tactile dome may include reflective components or surfaces, including textured or treated surfaces, that may help channel light through the tactile dome and along the dome walls such that the light is propagated toward the illuminable symbol of the key cap. A "symbol," as used herein, is a graphic, logo, text, letter, glyph, or other marking that conveys information. An "illuminable symbol" is a symbol that can be illuminated by a light source incorporated into an embodiment; typically, but not necessarily, the illuminable symbol is illuminated through an input surface such as a key cap, trackpad surface, or the like.

It will be appreciated that the mLED, or any other light sources described herein, may be positioned in any appropriate manner within the light integrated sensing membrane, including being positioned along or within one of the deformable layers positioned below the tactile dome and separated or spaced apart from the tactile dome. The mLED may be oriented and configured in a variety of manners to produce a desired optical effect, including being a top, rear, and/or side firing mLED. Further, the light source is not limited to a single mLED being positioned along a first and second deformable layer. Rather, the mLED may be one or a set or array of mLEDs positioned throughout the light integrated sensing membrane. In some cases, this may allow each key cap of a keyboard to be associated with a mLED of the array of mLEDs. Additionally or alternatively, each key cap, or a subset of key caps, of the keyboard may have multiple associated mLEDs of the array of mLEDs, as may be appropriate for a given configuration.

Reference will now be made to the accompanying drawings, which assist in illustrating various features of the present disclosure. The following description is presented for purposes of illustration and description. Furthermore, the description is not intended to limit the inventive aspects to the forms disclosed herein. Consequently, variations and modifications commensurate with the following teachings, and skill and knowledge of the relevant art, are within the scope of the present inventive aspects.

FIG. 1 depicts an electronic device 104 having a key assembly 108, although other input mechanisms may incorporate the embodiments discussed herein. The key assembly 108 may be one of a set of key assemblies that collectively form a keyboard or other input structure of the electronic device 104. The key assembly 108 may include a "stack-up" of components that cooperate to initiate an input signal in response to a force input. The key assembly 108 may enable substantially low-travel of an input surface (key cap) with a desired tactile response. The key assembly 108 may include a light integrated sensing membrane (not shown in FIG. 1), such as the light integrated sensing membrane discussed above and described in greater detail below. As described herein, the light integrated sensing membrane may include a deformable and light transmissible layer that includes both electrical terminals of a key (or other contact) switch and electrical traces of a light assembly. The electrical traces may be positioned on, and deform with, the deformable layer.

In a non-limiting example, as shown in FIG. 1, the electronic device 104 may be a laptop computer. However, it is understood that electronic device 104 may be any suitable device that operates with the key assembly 108 (or any other suitable device or input mechanism configured to receive a touch and/or force input from a user). Some example electronic devices may include data-entry devices, word-processing devices, desktop computers, notebook computers (as shown in FIG. 1), smart phones, tablets, portable media players, or the like. Other examples of electronic devices may include health monitoring devices (including pedometers, heart rate monitors, or the like), and other electronic devices, including digital cameras, printers, scanners, security systems or devices, electronics for automobiles, among other electronic devices. Suitable input mechanisms may include trackpads, mice, joystick buttons, and so on.

For purposes of illustration, FIG. 1 depicts the electronic device 104 as including the key assembly 108, an enclosure 112, a display 116, and one or more input/output members 119. It should be noted that the electronic device 104 may also include various other components, such as one or more ports (e.g., a charging port, a data transfer port, or the like), communications elements, additional input/output members (including buttons), and so on. As such, the discussion of any computing device, such the electronic device 104, is meant as illustrative only.

In a non-limiting example, the key assembly 108 may include a key cap 110. The key cap 110 may have an illuminable portion or symbol at which light from a light source (within the enclosure 112) may visually emphasize a location, size, and/or functionality of the key cap 110. The key cap 110 may be substantially surrounded by, and at least partially protrude from, the enclosure 112. For example, the key cap 110 may be positioned within or partially within one of an array of openings defined in the enclosure 112. The key cap 110 may be configured to receive a force input. The force input may depress the key cap 110 and trigger one or more input signals that may control the electronic device 104. As depicted, the key assembly 108, and associated keyboard, may be positioned within the electronic device 104 (e.g., within or partially within the enclosure 112). In other embodiments, the key assembly 108 may be a distinct, standalone component communicatively coupled with the electronic device 104 via a wireless or hardwired connection.

Figure 2:
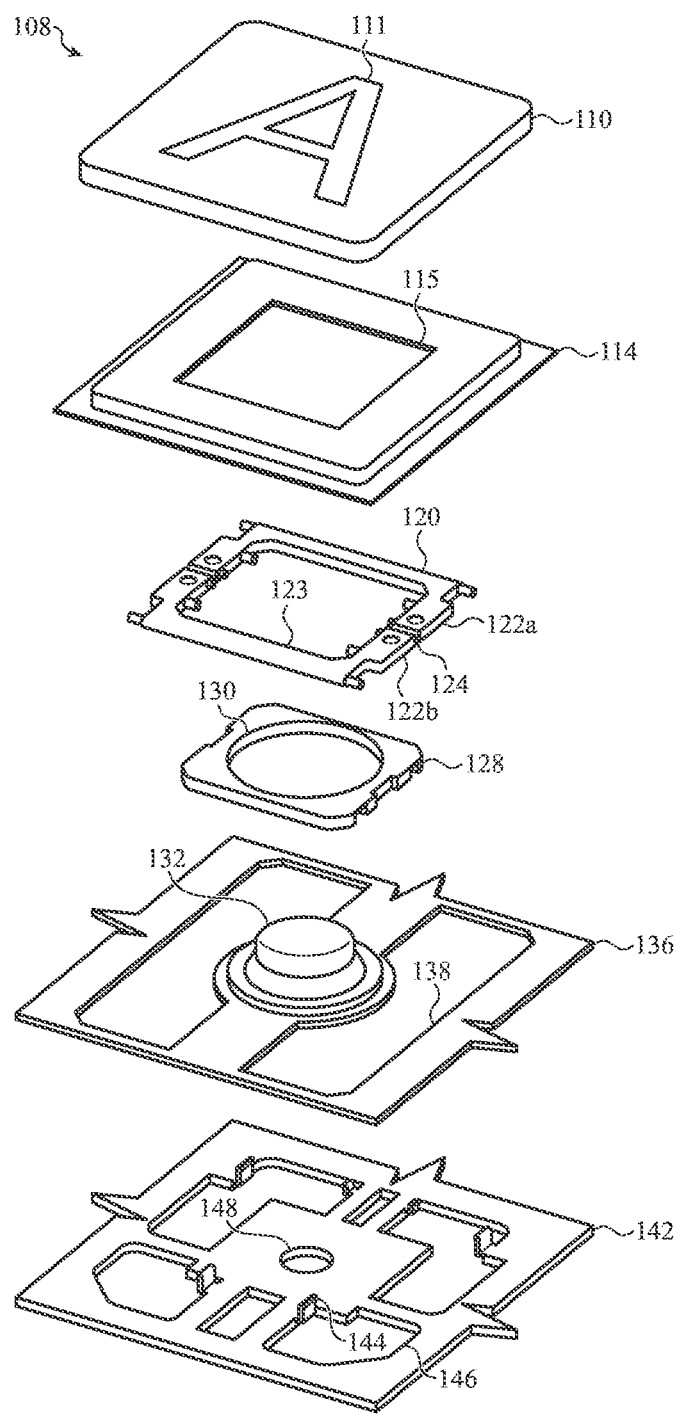
FIG. 2 depicts an exploded view of the key assembly of FIG. 1.

FIG. 2 depicts an illustrative exploded view of an embodiment of the key assembly 108 shown in FIG. 1. As described above, the key assembly 108 may be formed from a stack-up of layered components. Each layer and/or component of the stack-up of the key assembly 108 may provide different functionality and/or operations for the electronic device 104, as discussed herein. Although a key assembly 108 is shown as a single key assembly stack-up, it is understood that substantially all key assemblies (or a subset of key assemblies) of the electronic device 104 may be formed from similar components and/or layers in a similar configuration and/or function in a substantially similar manner as the single key assembly stack-up shown in FIG. 2. For purposes of illustration, FIG. 2 depicts the key assembly 108 as including a key cap 110, an illuminable symbol 111, a collar 114, a key opening 115, a butterfly mechanism 120, wings 122a, 122b, cavity 123, hinge 124, switch housing 128, switch opening 130, tactile dome 132, light integrated sensing membrane 136, series of membrane openings 138, feature plate 142, series of feature plate openings 146, engagement feature 144, and relief 148. The light integrated sensing membrane 136 may include a light source (not shown in FIG. 2A) that may be used to direct light through the key assembly 108 and toward the illuminable symbol 111. It should be noted that the key assembly 108 may also include various other components and/or different combinations of components. As such, the discussion of any key assembly 108, such as the key assembly 108, is meant as illustrative only.

FIGS. 3A-3F depict the key assembly 108 described with respect to FIGS. 1 and 2. In particular, FIGS. 3A-3F depict various elements of the key assembly 108 that may be used to trigger a switch event and provide light to an illuminable symbol of a key cap positioned above the light integrated sensing membrane 136. For the sake of clarity, some elements of the key assembly 108 associated with the light integrated sensing membrane 136 have been omitted in FIGS. 3A-3F.

Figure 3A:
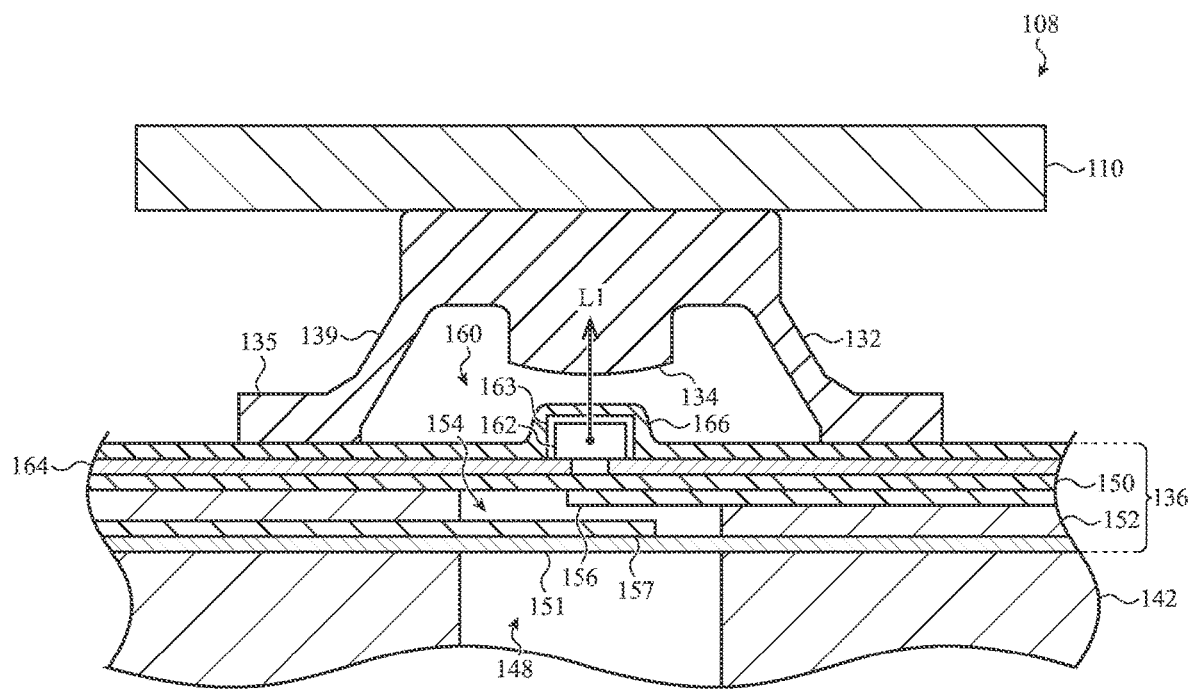
FIG. 3A depicts a cross-sectional view of a sample light integrated sensing membrane in an unactuated configuration, taken along line A-A of FIG. 1.

With reference to FIG. 3A, a cross-sectional view of the key assembly 108 is shown taken along line A-A of FIG. 1. As described above, the key assembly 108 may include a tactile dome 132 positioned below the key cap 110 and above the light integrated sensing membrane 136. In certain embodiments, the tactile dome 132 may have a base 135 positioned on a deformable region of the light integrated sensing membrane 136. The tactile dome 132 may be configured to collapse or buckle in response to an actuation (depression) of the key cap 110 positioned above the tactile dome 132, thereby producing a tactile effect at the key cap 110. This may cause a contact feature 134 of the tactile dome to advance toward the deformable region and cause the light integrated sensing membrane 136 to trigger a switch event, as described herein. The light integrated sensing membrane 136 may be positioned on the feature plate 142. The feature plate 142 may be a structural component of the key assembly 108 that is used to secure one or more components with the key assembly 108, including the light integrated sensing membrane 136, the switch housing 128, and/or the butterfly mechanism 120 (not shown in FIG. 3A). In the embodiment of FIG. 3A, the light integrated sensing membrane 136 is shown in an unactuated configuration.

As shown in FIG. 3A, the light integrated sensing membrane 136 may include first and second deformable layers 150, 151. The first and second deformable layers 150, 151 may be positioned below the tactile dome 132. The first and second deformable layers 150, 151 may be a set of deformable layers that are separated within the light integrated sensing membrane 136 by a spacer layer 152. The spacer layer 152 separate the first and second deformable layers 150, 151 and thus define a cavity 154 between the deformable layers. Each of the first and second deformable layers 150, 151 may have a first surface and a second surface. The first and second deformable layers 150, 151 may be constructed from any appropriate material including polyethylene terephthalate (PET), silicon, or the like; however, other materials may also be used, such as various plastics, synthetics and so on.

The first and second deformable layers 150, 151 may be coupled with electrical terminals or another element of a key switch positioned within the cavity 154 (e.g., on opposing sides or top and bottom regions of the cavity 154, respectively). For example, the first deformable layer 150 may have, or be coupled with, a first electrical terminal 156 and the second deformable layer 151 may have, or be coupled with, a second electrical terminal 157. The first and second electrical terminals 156, 157 may be a set of electrical terminals of a contact-based key switch that may complete an electrical circuit or switch when the first and second electrical terminals 156, 157 contact one another. It will be appreciated, however, that in other cases the first and second electrical terminals 156, 157 may be capacitive elements that cooperate to define a capacitive-based force sensor and/or other appropriate sensing structure for detecting movement of the key cap 110. The electrical terminals, or any other electrical circuits described herein, may be formed from various appropriate electrically conductive material, including silver or silver alloy, copper, or the like; however, other materials or combinations of materials may also be used, including conductive epoxy, low temperature solder, and copper and/or alloy formed over or with a flexible printed circuit, among other materials and combinations of the materials.

Figure 3B:
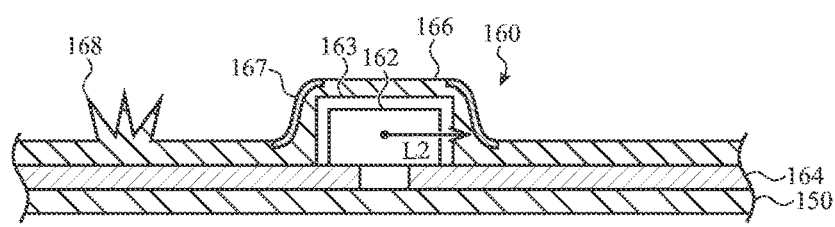
FIG. 3B depicts an embodiment of the light integrated sensing membrane of FIG. 3A.
Figure 3C:
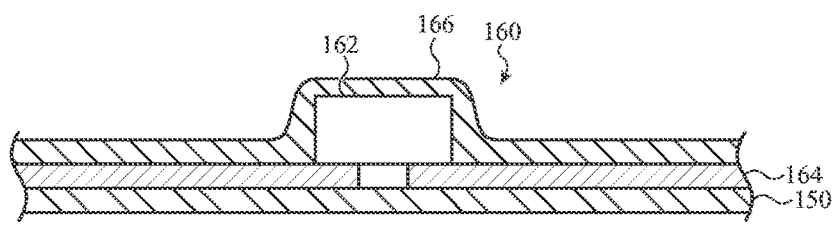
FIG. 3C depicts another embodiment of the light integrated sensing membrane of FIG. 3A.
Figure 3D:
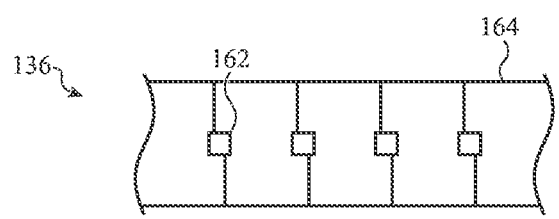
FIG. 3D depicts a top view of the electrical trace layer of the light integrated sensing membrane of FIG. 3A.

As shown and described in greater detail with respect to FIG. 3D, when the tactile dome 132 collapses or buckles, a volume of the cavity 154 may be reduced through motion of the first and second deformable layers 150, 151 (e.g., the deformable layers may deform or collapse into the cavity). This may cause the first and second electrical contacts 156, 157 to physically contact one another and trigger a switch event (e.g., by initiating an electrical response corresponding to the depression of the key cap 110). In this regard, the tactile dome 132 may be an electrically insulating structure. However, in other configurations, the tactile dome 132 may include an electrically conductive puck or other structure that may be used to complete a switch defined on and/or in the light integrated sensing membrane 136, including being substantially formed from an electrically conductive material.

The light integrated sensing membrane 136 may include a light assembly, such as the light assemblies discussed above and described in greater detail below. As shown in FIG. 3A, the light integrated sensing membrane 136 may include a light assembly 160. The light assembly 160 may be positioned along a top surface of the first deformable layer 150 and used to illuminate an illuminable symbol of a key cap positioned above the light integrated sensing membrane 136 (e.g., illuminable symbol 111 and key cap 110 of FIG. 2). In this regard, the light assembly 160 may be configured to emit light into the key assembly 108 and optionally through at least a portion of the tactile dome 132 (or other translucent portion or layer of the key assembly 108) and illuminate the illuminable symbol 111 of the key cap 110 above the tactile dome.

To facilitate the foregoing, the light assembly 160 may include a light source 162. The light source 162 may be a micro light emitting diode (mLED), which may use or be microscopic light emitting diode elements that cooperate to form a light source. In other cases, other light sources may be implemented according to the embodiment described herein, including various combinations of a light emitting diode (LED), light guide, liquid crystal display (LCD), organic light emitting diode (OLED), fluorescent light, and/or other light emitting elements that propagate light through the key assembly 108 and toward the illuminable symbol 111. In the embodiment of FIG. 3A, the light source 162 may be a top firing mLED that directs light through or partially through the tactile dome 132 positioned below the key cap 110 and toward an illuminable symbol 111 of the key cap 110; however, other configurations and arrangements are described herein, including mLEDs that are side and/or rear firing mLEDs. For example, as shown in FIG. 3A, the light source 162 may direct light substantially along light path L1. It will be appreciated that light path L1 (or any light path described herein) may be depicted for purposes of illustration only. Rather than suggest that light emitted from the light assembly 160 travels exclusively along a particular light path, the illustrated light path L1 is depicted to be a representation of diffuse light that propagates within the key assembly 108.

The light source 162 may be partially or fully encapsulated by an optical layer 163. The optical layer 163 may be a phosphor layer and/or other light transmissible layer that may form a protective barrier around the light source 162. The optical layer 163 may also help control an optical characteristic of light emitted from the light source 162, such as a color, brightness, sharpness, and/or direction of the emitted light. The light assembly 160 may also include protective coating 166 that may form a protective barrier between the light source 162 and/or the optical layer 163 and an environment of the key assembly 108. Below the light source 162, light assembly 160 may include electrical traces 164 positioned on the deformable layers 150, 151. The electrical traces 164 may provide electrical power to the light source 162, which may be used to selectively activate the light source 162 such that light source 162 emits light toward the illuminable symbol 111. The electrical traces 164 may be coupled with a processing unit and/or other component including computer executable logic that may allow the light source 162 to be selectively operable and/or dynamically modifiable based on one or more functions or commands of an electronic device (e.g., electronic device 104 of FIG. 1).

As shown in FIG. 3A, the light assembly 160 is positioned on the first deformable layer 150. In this regard, the electrical traces 164 may be positioned on or connected to the first deformable layer 150. The first electrical terminal 156 of the key switch, described above, may also be positioned on the first deformable layer 150. In particular, a first or top surface of the first deformable layer 150 may be connected to, or otherwise support or integrate, the electrical traces 164 and a second or bottom surface of the first deformable layer 150 may connected to, or otherwise support or integrate, the first electrical contact 156. This may allow the first deformable layer 150 to be used both as a light guide and a component of a contact-based key switch. When the first deformable layer 150 deforms into the cavity 154, the first electrical terminal 156 may electrically couple to, and/or physically contact, the second electrical terminal 157 in order to generate an input signal. In other embodiments, the first electrical terminal 156 may electrically couple to a different element of an embodiment to provide other functionality.

The light assembly 160 may be configured to direct or couple light into the tactile dome 132 positioned below the key cap 110. This may allow the tactile dome 132 to be used as a light pipe or conduit that may propagate light between, for example, the light source 162 and the illuminable symbol 111. In this regard, the tactile dome 132 may having a translucent portion, as described herein. For example, the tactile dome 132 may be constructed from silicon, rubber, metal or other elastically deformable material that may include translucent or light transmissible regions, as may be appropriate for a given application.

The light assembly 160 may be arranged in various configurations and positions within the key assembly 108 relative to the light integrated sensing membrane 136 in order to illuminate the illuminable symbol 111 and optionally a portion of the tactile dome 132. In the embodiment of FIG. 3A, the light assembly 160 is arranged such that the light source 162 is positioned under or substantially aligned with the contact feature 134 of the tactile dome 132. The contact feature 134 may be a nub or other protrusion, which extends from or along an underside of the tactile dome 132. Accordingly, and as shown in FIG. 3F, when the tactile dome 132 collapses or buckles, the contact feature 134 may contact the light assembly 160 and partially or fully surround the light source 162. This may allow light from the light source 162 to couple into the tactile dome 132. In other cases, as described in greater detail below with respect to FIG. 4F, the light assembly 160 may be positioned about a periphery of the tactile dome 132, for example, such as about the base 135 of the tactile dome 132. This may allow light from the light source 162 to couple into, and propagate through, the tactile dome 132, which may be at least partially directed and/or channeled by a wall 139 of the tactile dome 132, as described herein.

With reference to FIG. 3B, the light assembly 160 is shown in a configuration in which the protective coating 166 may be used as a light guide. For example, the protective coating 166 may be a translucent material that is configured to receive and direct light to a specified region within the key assembly 108. To illustrate, the light source 162 may be a side firing mLED that is configured to emit light substantially along light path L2. The light path L2 may extend along a longitudinal direction of the protective coating 166, which may allow light to enter a translucent body of the protective coating 166 and propagate therethrough. To facilitate the foregoing, the light assembly 160 may include reflective components 167. The reflective component 167 may be positioned within, or partially within, the protective coating 166 and about the light source 162. The reflective components 167 may exhibit a reflective characteristic that helps redirect light emitted from the light source 162 into the body of the protective coating 166.

The protective coating 166 may also include at least one light extraction feature, such as light extraction feature 168 shown in FIG. 3B. The light extraction feature 168 may be positioned away from the light source 162 and configured to expel light from the protective coating 166. The light extraction feature 168 may be a textured surface, a lens, an aperture, and/or other region of the protective coating 166 that is configured to propagate light away from the light assembly 160, for example, and toward the key cap 110. In this regard, the protective coating 166 may be configured to receive light from the light source 162 and direct the received light to the light extraction feature 168. As shown in FIG. 3B, the light extraction feature 168 is separated or spaced apart from the light source 162. As such, the light extraction feature 168 may be placed in any appropriate position along the protective coating 166 to facilitate illumination of an illuminable symbol of the key cap 110. In some cases, the light extraction feature 168 may be positioned along the protective coating 166 such that the illuminable symbol of the key cap 110 exhibits a desired optical effect, such as enhancing brightness or altering a visible color of the illuminable symbol on the key cap 110.

With reference to FIG. 3C, the light assembly 160 is shown in a configuration in which the protective coating 166 is positioned over the light source 162. The protective coating 166 may be an optical epoxy or other translucent material that is formed over the light source 162. The protective coating 166 may be doped with phosphor or other appropriate material. In this manner, the protective coating 166 may help control an optical characteristic of light emitted from the light source 162, including controlling a color, brightness, sharpness, and/or direction of the emitted light. The protective coating 166 may be applied to the light source 162 via an overmolding process. For example, the light source 162 and associated electrical traces 164 may be positioned along the first deformable layer 150, and may deform with the deformable layer. The protective coating 166 may be a moldable material that is flowed or formed over the light source 162, electrical traces 164, the first deformable layer 150 and/or other components of the key assembly 108. The overmolding of the protective coating 166 may help secure the light assembly within the light integrated sensing membrane 136. The light source 162 may be oriented and/or arranged in a configuration that corresponds with an optical and/or structure characteristic of the overmolded protective coating 166. For example, the light source 162 may be a top, rear, and/or side firing mLED as may be appropriate for a given configuration of the overmolded protective coating 166.

With reference to FIG. 3D, a top view of the electrical traces 164 of the light integrated sensing membrane 136 is shown. The electrical traces 164 may be used to route electrical signals to multiple light sources of a keyboard, such as light source 162. Generally, the electrical traces 164 may be arranged in a parallel type circuit that may selectively route electrical signals to various ones of the light sources. It will be appreciated, however, that in other embodiments the electrical traces 164 may be arranged in various other circuit patterns and constructions. Further, insofar as the electrical traces are formed on the deformable layer, they may also deform, move, or the like as the deformable layer moves or otherwise deforms.

Figure 3E:
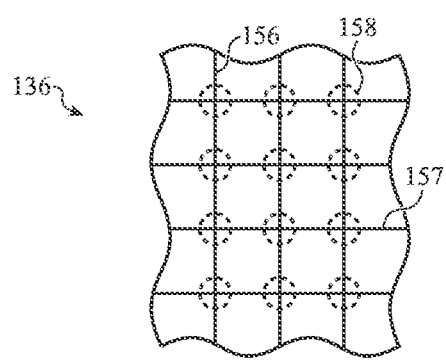
FIG. 3E depicts a top view of the terminals of the light integrated sensing membrane of FIG. 3A.
Figure 3F:
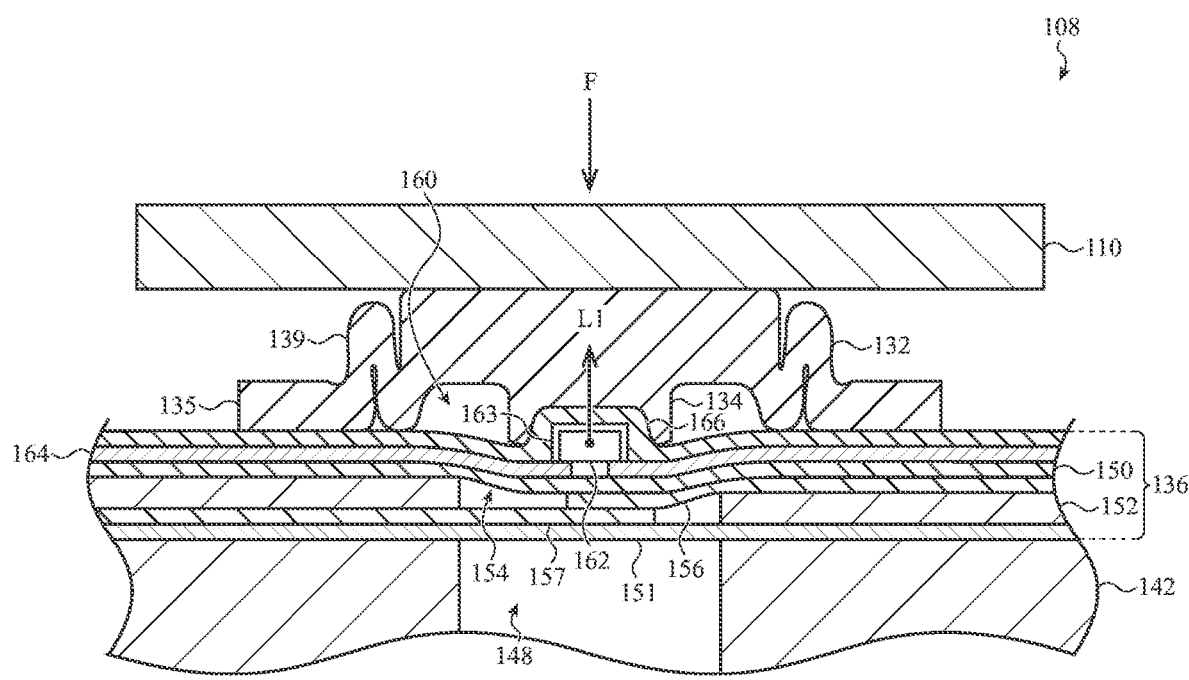
FIG. 3F depicts a cross-sectional view of the sample light integrated sensing membrane of FIG. 3A in an actuated configuration, taken along line A-A of FIG. 1.

With reference to FIG. 3E, a top view of the first and second electrical terminals 156, 157 of the light integrated sensing membrane 136 are shown. The first and second electrical terminals 156, 157 may be used to route electrical signals to various key assemblies across a keyboard. The first and second electrical terminals 156, 157 may be arranged in a grid and separated from one another by the cavity 154 (as described with respect to FIG. 3A). When the first and second electrical terminals 156, 157 electrically couple to and/or physically contact one another (that is, when the deformable layers collapse or deform into the cavity), the light integrated sensing membrane 136 may trigger a switch event. Accordingly, and as shown in FIG. 3E, an array of contact regions 158 may be defined where the first and second electrical contacts overlap or pass over one another. The light integrated sensing membrane 136 may receive a force input at or near one or more of the array of contact regions 158 and cause the first and second electrical contacts to contact one another at the respective one of the array of contact regions 158 and trigger a corresponding switch event. In this regard, the array of contact regions 158 may correspond to regions of a keyboard in which an individual key assembly is positioned (e.g., key assembly 108 of FIG. 1). It will be appreciated, however, that in other embodiments, the first and second electrical terminals 156, 157 may be arranged in various other circuit patterns and constructions.

With reference to FIG. 3F, the light integrated sensing membrane 136 is shown in an actuated configuration. In an actuated configuration, the tactile dome 132 may press down onto the light integrated sensing membrane 136 in response to a force F (which may be exerted on the tactile dome 132 by a key cap receiving a mechanical press). The force F may cause the tactile dome 132 to collapse or buckle, for example, as shown in FIG. 3F. In a buckled state, the contact feature 134 may exert a force on the light integrated sensing membrane 136. In particular, the contact feature 134 may exert a force on the light integrated sensing membrane 136 that causes the first and second deformable layers 150, 151 to be pinched, squeezed, translated, or otherwise deform such that the first and second deformable layers 150, 151 move toward one another to electrically couple to, and potentially physically contact, one another. This motion may cause one or both of the deformable layers to deform into the cavity. Movement of the first and second deformable layers 150, 151 may cause the first and second electrical terminals 156, 157 to contact one another and trigger a switch event. When the first and second deformable layers 150, 151 translate by the action of the contact feature 134, a portion of the light integrated sensing membrane 136 may extend into the relief 148. The relief 148 may thus be used to provide a desired tactile response to the key cap 110 during actuation and/or further reduce the stack-up height, as described herein.

FIG. 3F depicts the contact feature 134 of the tactile dome 132 contacting the light assembly 160. In particular, the contact feature 134 is shown at least partially encompassing or surrounding the light source 162 when the tactile dome 132 is depressed toward the light integrated sensing membrane 136. In the collapsed state, the tactile dome 132 may be used as light pipe or light conduct that directs light between the light source 162 and an illuminable symbol positioned above the tactile dome 132. For example, the light path L1 may extend from the light source 162 and couple directly into the tactile dome 132 at the contact feature 134 when collapsed. The tactile dome 132 may be configured to expel the light received from the light assembly 160 in a particular manner, for example, such as allowing the light to escape from the tactile dome 132 along a surface of the tactile dome 132 that is positioned along an underside of a key cap. This may allow the light assembly 160 (in conjunction with the optically coupled tactile dome 132) to illuminate the illuminable symbol 111 according to a predetermined optical effect (e.g., such as maximizing a brightness of the illuminable symbol on the key cap).

FIGS. 4A-4I depict key assemblies 208a-208i. As described herein, the key assemblies 208a-208i may be configured to operate in a manner substantially analogous to the key assembly 108 described with respect to FIGS. 1-3F. For example, the key assemblies 208a-208i may include a key cap configured to receive a force input or mechanical press that is used to collapse or buckle a tactile dome positioned below the key cap. Upon buckling, the tactile dome may contact a light integrated sensing membrane and trigger a switch event that may be used to control a function of a computing device (e.g., electronic device 104 of FIG. 1). Accordingly, the key assemblies 208a-208i may include similar components as that of key assembly 108, including a key cap 210, a tactile dome 232, a contact feature 234, a base 235, a wall 239, a feature plate 242, and a relief 248. The key assemblies 208a-208i may also include a light integrated sensing membrane that includes a light source (mLED) and electrical terminals of a key switch and/or another element for detecting a key press, according to the embodiments described with respect to FIGS. 4A-4I.

Figure 4A:
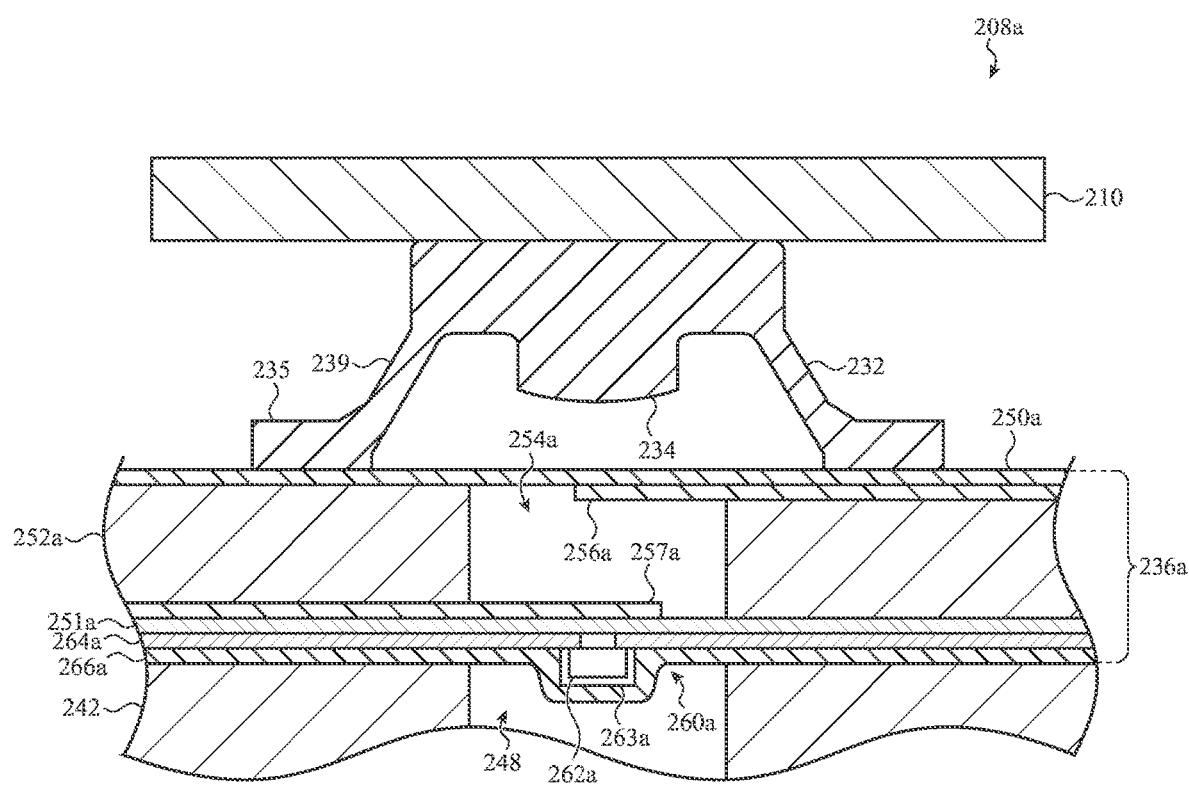
FIG. 4A depicts a cross-sectional view of another embodiment of a light integrated sensing membrane, taken along line A-A of FIG. 1.

With reference to FIG. 4A, a cross-sectional view of the key assembly 208a is shown taken along line A-A of FIG. 1. As shown in FIG. 4A, the key assembly 208a includes a light integrated sensing membrane 236a. The light integrated sensing membrane 236a may be configured to operate in a manner substantially analogous to the light integrated sensing membrane 136 described with respect to FIGS. 1-3F. For example, the light integrated sensing membrane 236a may be configured to illuminate an illuminable symbol of the key assembly 208a and trigger a switch event. In particular, the light integrated sensing membrane 236a includes at least one deformable layer having electrical terminals for a contact-based key switch and electrical traces for a mLED or other appropriate light source. Accordingly, the light integrated sensing membrane 236a may include similar components as that of the light integrated sensing membrane 136, including a first deformable layer 250a, a second deformable layer 251a, a spacer layer 252a separating the deformable layers 250a, 251a, a cavity 254a, a first electrical terminal 256a, a second electrical terminal 257a, light assembly 260a, light source 262a, optical layer 263a, electrical traces 264a, and protective coating 266a.

Notwithstanding the foregoing, in the embodiment of FIG. 4A, the light assembly 260a may be positioned along the second deformable layer 251a. In particular, the light assembly 260a may be positioned along a bottom surface of the second deformable layer 251a. In this regard, the light source 262a of the light assembly 260a may extend below the second deformable layer 251a and at least partially into the relief 248 of the feature plate 242. This may reduce the z-profile of the key assembly 208a by allowing some or all of the volume of the light source 262a to be positioned within a region defined by a thickness of the feature plate 242. In the embodiment of FIG. 4A, the light source 262a may be a rear firing mLED that may project light through the light integrated sensing membrane 236a (e.g., through the first and second deformable layers 250a, 251a) and toward an illuminable symbol of key cap 210. In other cases, other configurations of the light source are contemplated, including side and top firing mLED, which may be used to direct light toward various other portions of the key assembly 208a and/or create various different optical effects at the key cap 210.

Figure 4B:
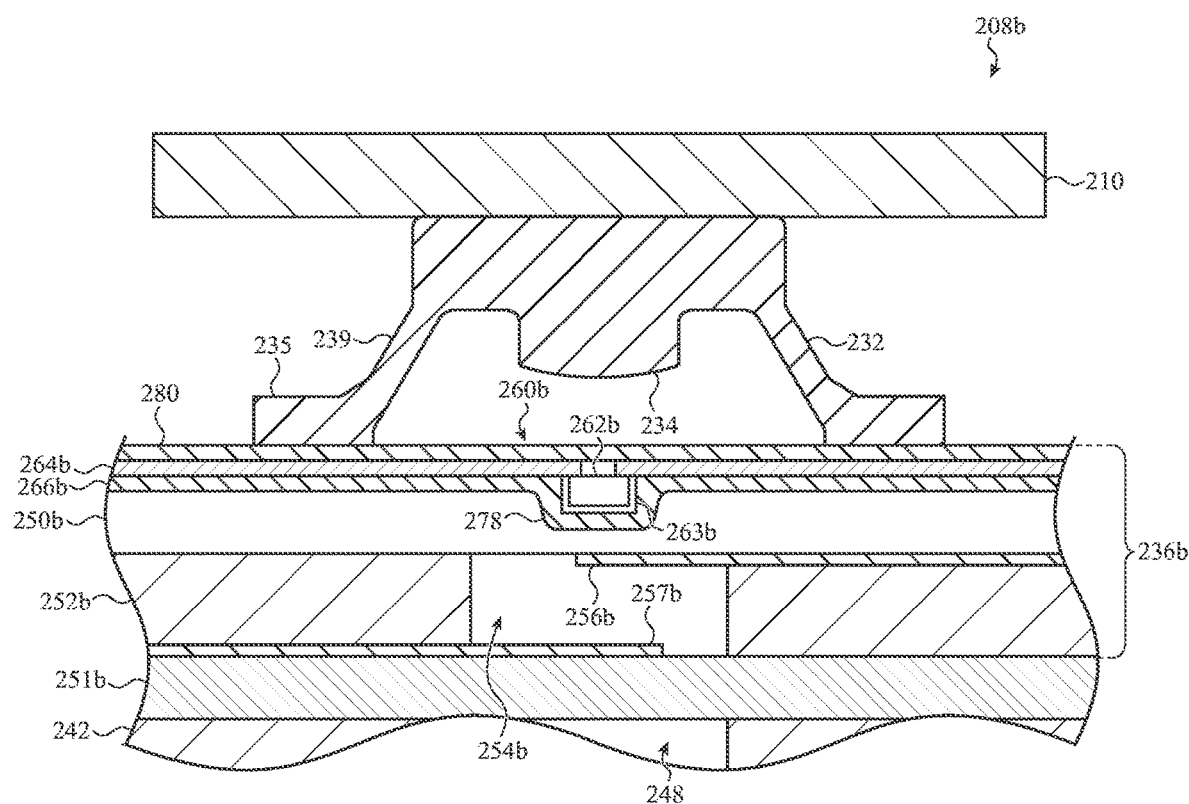
FIG. 4B depicts a cross-sectional view of another embodiment of a light integrated sensing membrane, taken along line A-A of FIG. 1.

With reference to FIG. 4B, a cross-sectional view of the key assembly 208b is shown taken along line A-A of FIG. 1. As shown in FIG. 4B, the key assembly 208b includes a light integrated sensing membrane 236b. The light integrated sensing membrane 236b may be configured to operate in a manner substantially analogous to the light integrated sensing membrane 136 described with respect to FIGS. 1-3F. For example, the light integrated sensing membrane 236b may be configured to illuminate an illuminable symbol of the key assembly 208b and trigger a switch event. In particular, the light integrated sensing membrane 236b includes at least one deformable layer having electrical terminals for a contact-based key switch and deformable electrical traces for a mLED or other appropriate light source. That is, the electrical terminals may electrically couple to one another upon physical contact, when the at least one deformable layer deforms a sufficient distance. Accordingly, the light integrated sensing membrane 236b may include similar components as that of the light integrated sensing membrane 136, including a first deformable layer 250b, a second deformable layer 251b, a spacer layer 252b separating the deformable layers 250b, 251b, a cavity 254b, a first electrical contact 256b, a second electrical contact 257*b*, light assembly 260*b*, light source 262*b*, optical layer 263*b*, electrical traces 264*b*, and protective coating 266*b*.

Notwithstanding the foregoing, in the embodiment of FIG. 4B, the light assembly 260*b* may be at least partially recessed into, or encapsulated by, the first deformable layer 250*b*. In particular, the light assembly 260*b* may be positioned along the first deformable layer 250*b* such that the light source 262*b* extends partially or fully into a thickness of the first deformable layer 251*b*. As shown in FIG. 4B, the first deformable layer 250*b* may include a pocket 278. The pocket 278 may be a recess or groove formed into a surface of the first deformable layer 250*b*. The pocket 278 may be configured to receive the light source 262*b* such that the pocket 278 surrounds or conforms to a shape of the light source 262*b*. In some cases, as shown in FIG. 4B, a protective coating 280 may be applied above the light assembly 260*b*. The protective coating 280 may form a barrier between the light assembly 260*b* and an environment of the key assembly 208*b* and/or dampen the impact of the contact feature 234 when the tactile dome 232 buckles and contacts the light integrated sensing membrane 236*b*.

Recessing the light assembly 260*b* at least partially into the first deformable layer 250*b* may enhance the ability of the light integrated sensing membrane 236*b* to function as a light guide. As described above, one or both of the first and second deformable layer 250*b*, 251*b* may be used generally as a light guide or light conduit. For example, one or both of the first and second deformable layers 250*b*, 251*b* may be a translucent or light transmissible structure that is used to propagate light throughout the key assembly 208*b*. When the light source 262*b* is positioned within the pocket 278, as shown in FIG. 4B, light may be optically coupled with the first deformable layer 250*b* along a longitudinal direction of the first deformable layer 250*b*. This may allow the first deformable layer 250*b* to propagate light received from the light source 262*b* along a greater distance and/or prevent light leakage within the key assembly 208*b*. While the embodiment depicted with respect to FIG. 4B is shown with light assembly 260*b* recessed with respect to the top surface of the first deformable layer 250*b*, it will appreciated that other configurations are contemplated within the scope of the present disclosure, including arranging the light assembly 260*b* so that the light source 262*b* is recessed within a bottom surface of the first deformable 250*b*, a top surface of the second deformable layer 251*b*, a bottom surface of the second deformable layer 251*b* and/or any other appropriate configuration.

Figure 4C:
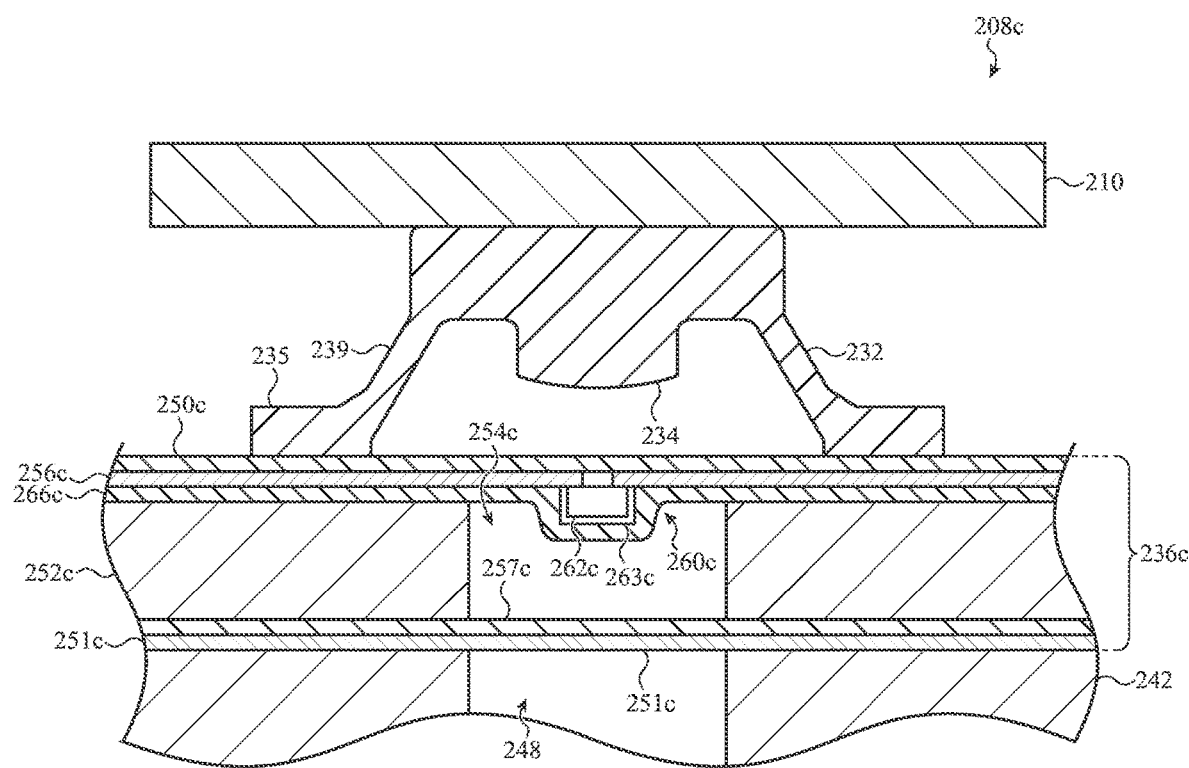
FIG. 4C depicts a cross-sectional view of another embodiment of a light integrated sensing membrane, taken along line A-A of FIG. 1.

With reference to FIG. 4C, a cross-sectional view of the key assembly 208*c* is shown taken along line A-A of FIG. 1. As shown in FIG. 4C, the key assembly 208*c* includes a light integrated sensing membrane 236*c*. The light integrated sensing membrane 236*c* may be configured to operate in a manner substantially analogous to the light integrated sensing membrane 136 described with respect to FIGS. 1-3F. For example, the light integrated sensing membrane 236*c* may be configured to illuminate an illuminable symbol of the key assembly 208*c* and trigger a switch event. In particular, the light integrated sensing membrane 236*c* includes at least one deformable layer having electrical terminals for a contact-based key switch and electrical traces for a mLED or other appropriate light source. As the deformable layer deforms, the electrical traces may likewise move or otherwise deform. Accordingly, the light integrated sensing membrane 236*c* may include similar components as that of the light integrated sensing membrane 136, including a first deformable layer 250*c*, a second deformable layer 251*c*, a spacer layer 252*c* separating the first and second deformable layers, a cavity 254*c*, an electrical contact 257*c*, light assembly 260*c*, light source 262*c*, optical layer 263*c*, and protective coating 266*c*.

Notwithstanding the foregoing, in the embodiment of FIG. 4C, the light assembly 260*c* may be positioned along a bottom surface of the first deformable layer 250*c*. In particular, the light assembly 260*c* may be positioned along the bottom surface of the first deformable layer 250*c* such that the light source 262*c* extends at least partially into the cavity 254*c*. This may reduce the z-profile of the key assembly 208*c* by allowing some or all of the volume of the light source 262*c* to be positioned within a region defined by a thickness of the spacer layer 252*c* separating the first and second deformable layers 250*c*, 251*c*.

The light source 262*c* may be electrically coupled with electrical traces 256*c* that are coupled with, or formed on, the first deformable layer 250*c* and extend into the cavity 254*c*. The electrical traces 256*c* may be configured to selectively provide an electrical signal to the light source 262*c* that may cause the light source 262*c* to emit light toward an illuminable symbol of key cap 210. The electrical traces may deform as the deformable layer deforms. The first deformable layer 250*c* may also include electrical terminals or a key switch (not shown in FIG. 4C) that cooperate with the electrical contact 257*c* positioned along the second deformable layer 251*c* to complete an electrical circuit or switch in response to a collapsing or buckling of the tactile dome 232. Accordingly, the same surface of the first deformable layer 250*c* may be used to mount or couple with the electrical terminals of the key switch and the electrical traces of the light source 262*c*.

Figure 4D:
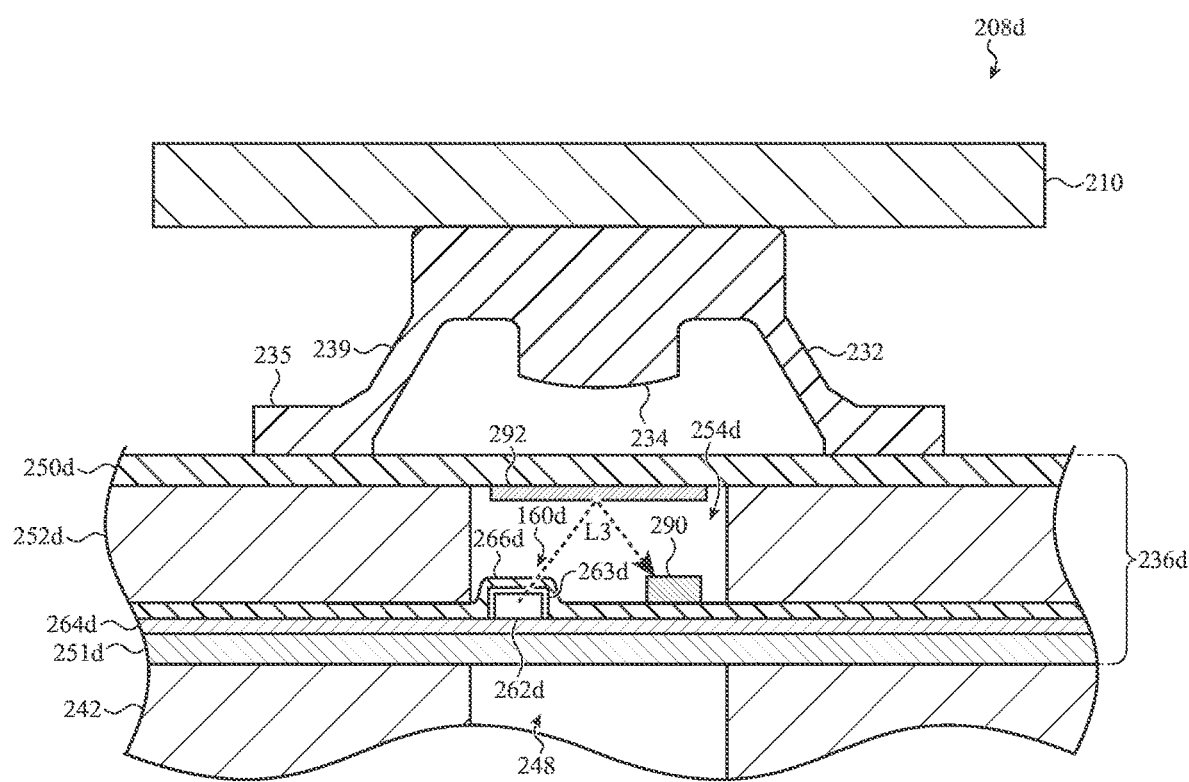
FIG. 4D depicts a cross-sectional view of another embodiment of a light integrated sensing membrane, taken along line A-A of FIG. 1.

With reference to FIG. 4D, a cross-sectional view of the key assembly 208*d* is shown taken along line A-A of FIG. 1. As shown in FIG. 4D, the key assembly 208*d* includes a light integrated sensing membrane 236*d*. The light integrated sensing membrane 236*d* may be configured to operate in a manner substantially analogous to the light integrated sensing membrane 136 described with respect to FIGS. 1-3F. For example, the light integrated sensing membrane 236*d* may be configured to illuminate an illuminable symbol of the key assembly 208*d* and trigger a switch event. In particular, the light integrated sensing membrane 236*d* includes at least one deformable layer having electrical terminals for a contact-based key switch and electrical traces for a mLED or other appropriate light source. Accordingly, the light integrated sensing membrane 236*d* may include similar components as that of the light integrated sensing membrane 136, including a first deformable layer 250*d*, a second deformable layer 251*d*, a spacer layer 252*d*, a cavity 254*d*, light assembly 260*d*, light source 262*d*, optical layer 263*d*, electrical traces 264*d*, and protective coating 266*d*.

Notwithstanding the foregoing, in the embodiment of FIG. 4D, the light assembly 260*d* may be positioned along a top surface of the second deformable layer 251*d*. In particular, the light assembly 260*d* may be positioned along a top surface of the second deformable layer 251*d* such that the light source 262*d* extends at least partially into the cavity 254*d*. This may reduce the z-profile of the key assembly 208*d*, by allowing some or all of the volume of the light source 262*d* to be positioned within a region defined by a thickness of the spacer layer 252*d*.

In the embodiment of FIG. 4D, the light integrated sensing membrane 236*d* may include an optical-based switch that detects variations in reflected light to estimate a force received along the first deformable layer 250*d*. For example, the light integrated sensing membrane 236*d* may include an optical sensor 290 positioned on the top surface of the second deformable layer 251d. The optical sensor 290 may be a micro photo sensor that is configured to be positioned within the cavity 254d. The optical sensor 290 may detect light emitted from the light assembly 260d and determine a relative position of the first deformable layer 250d. To facilitate the foregoing, the light integrated sensing membrane 236d may include a reflective component 292. The reflective component 292 may be positioned along the bottom surface of the first deformable layer 250d and within or partially within the cavity 254d. The optical sensor 290 may detect the reflection or propagation of light emitted from the light assembly 260d substantially along a light path L3 to estimate movement of the first deformable layer 250d. For example, movements of the first deformable layer 250d may alter the distance of the light path L3, which may be detectable by the optical sensor 290. As described herein, the first deformable layer 250a may bend or deform into the cavity 254d in response to a collapsing or buckling of the tactile dome 232 (which may be caused by a mechanical press exerted on a key cap positioned above the tactile dome 132). As such, the optical sensor 290 may correlate the altered light path L3 with the bending of the first deformable layer 250a to estimate a force input received by an associated keyboard key, such as key cap 210.

Figure 4E:
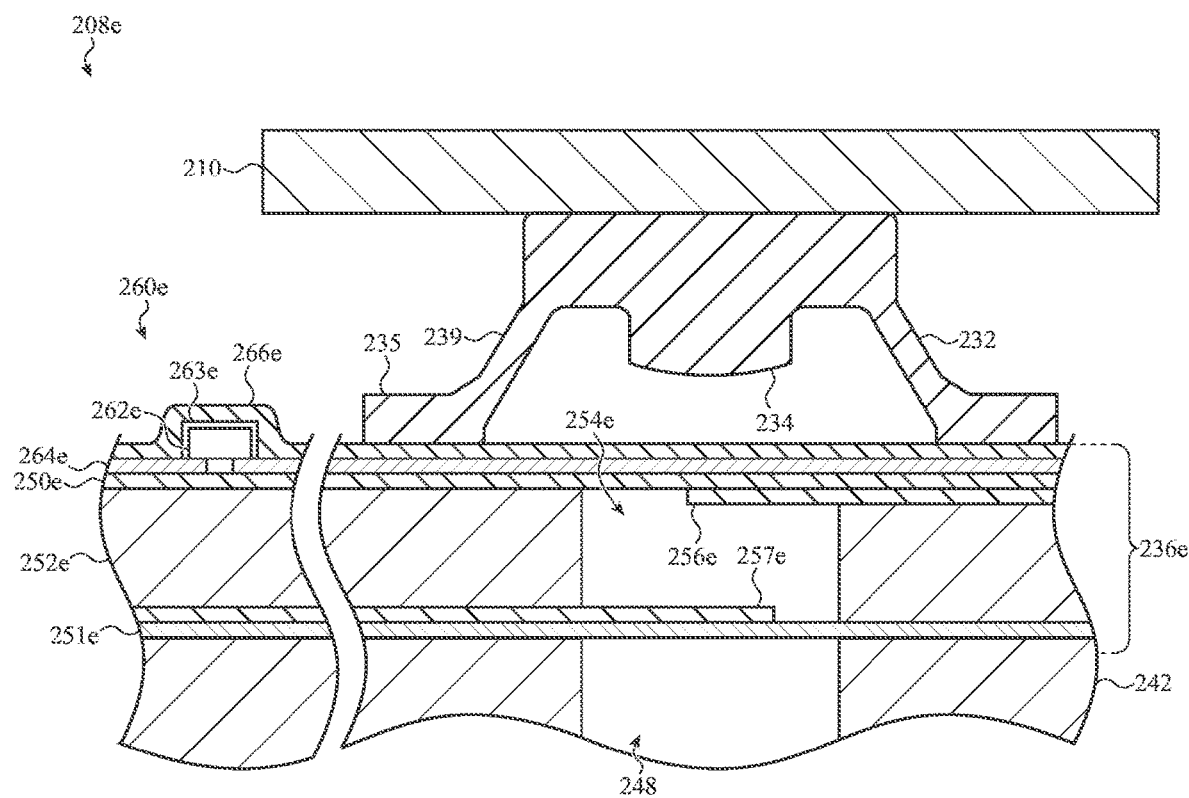
FIG. 4E depicts a cross-sectional view of another embodiment of a light integrated sensing membrane, taken along line A-A of FIG. 1.

With reference to FIG. 4E, a cross-sectional view of the key assembly 208e is shown taken along line A-A of FIG. 1. As shown in FIG. 4E, the key assembly 208e includes a light integrated sensing membrane 236e. The light integrated sensing membrane 236e may be configured to operate in a manner substantially analogous to the light integrated sensing membrane 136 described with respect to FIGS. 1-3F. For example, the light integrated sensing membrane 236e may be configured to illuminate an illuminable symbol of the key assembly 208e and trigger a switch event. In particular, the light integrated sensing membrane 236e includes at least one deformable layer having electrical terminals for a contact-based key switch and electrical traces for a mLED or other appropriate light source. Accordingly, the light integrated sensing membrane 236e may include similar components as that of the light integrated sensing membrane 136, including a first deformable layer 250e, a second deformable layer 251e, a spacer layer 252e separating the deformable layers, a cavity 254e, a first electrical contact 256e, a second electrical contact 257e, light assembly 260e, light source 262e, optical layer 263e, electrical traces 264e, and protective coating 266e.

Notwithstanding the foregoing, in the embodiment of FIG. 4E, the light assembly 260e may be positioned along a top surface of the first deformable layer 250a and separated or offset from the tactile dome 232. In particular, the light assembly 260e may be positioned adjacent the base 235 of the tactile dome such that the light source 262e is positioned about a periphery of the tactile dome 232. In this regard, the light source 262e may be a side firing mLED that is configured to propagate light towards the tactile dome 232. However, in other embodiments, the light source 262e may be a top firing mLED that may be configured to illuminate an illuminable symbol of a key cap positioned above the tactile dome 232 without using the tactile dome 232 as a light guide or light conduit, which may be the case where the tactile dome 232 is formed from a non-transparent material or includes select non-transparent regions.

Figure 4F:
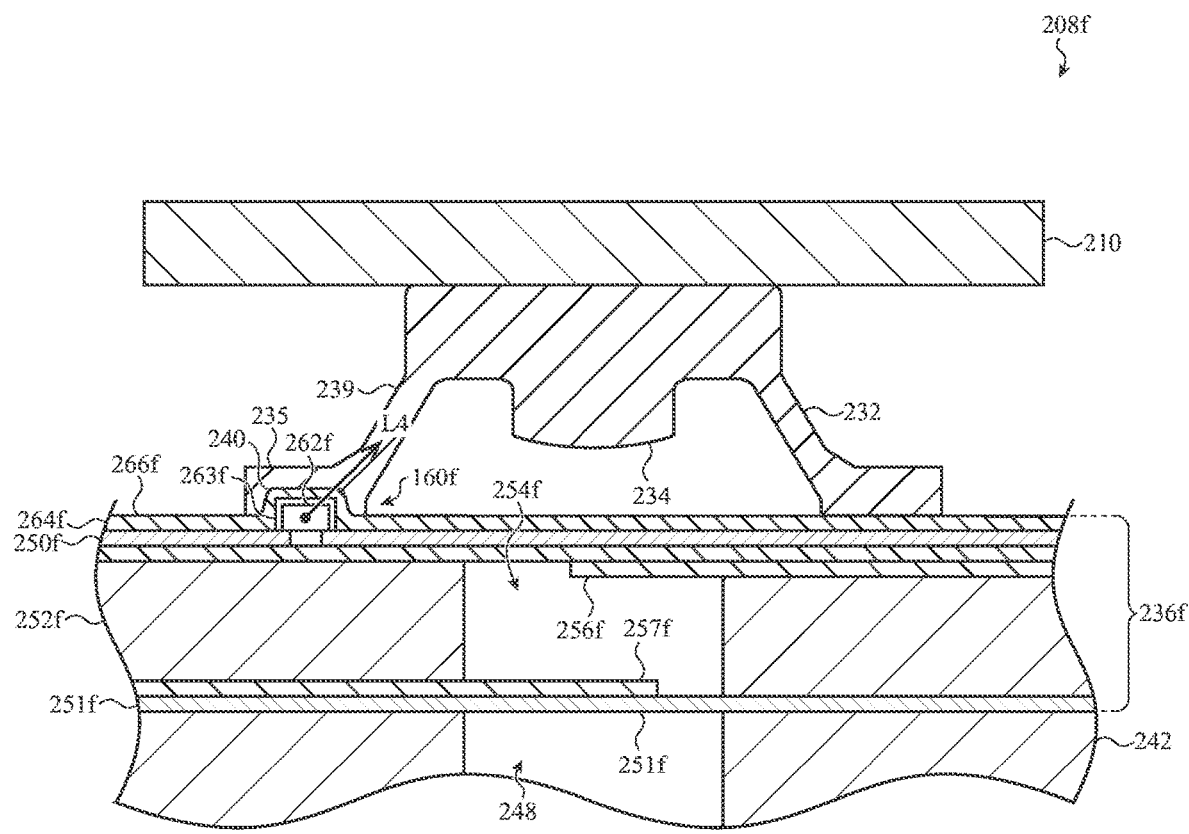
FIG. 4F depicts a cross-sectional view of another embodiment of a light integrated sensing membrane, taken along line A-A of FIG. 1.

With reference to FIG. 4F, a cross-sectional view of the key assembly 208f is shown taken along line A-A of FIG. 1. As shown in FIG. 4F, the key assembly 208f includes a light integrated sensing membrane 236f. The light integrated sensing membrane 236f may be configured to operate in a manner substantially analogous to the light integrated sensing membrane 136 described with respect to FIGS. 1-3F. For example, the light integrated sensing membrane 236f may be configured to illuminate an illuminable symbol of the key assembly 208f and trigger a switch event. In particular, the light integrated sensing membrane 236f includes at least one deformable layer having electrical terminals for a contact-based key switch and electrical traces for a mLED or other appropriate light source. Accordingly, the light integrated sensing membrane 236f may include similar components as that of the light integrated sensing membrane 136, including a first deformable layer 250f, a second deformable layer 251f, a spacer layer 252f separating the deformable layers, a cavity 254f, a first electrical contact 256f, a second electrical contact 257f, light assembly 260f, light source 262f, optical layer 263f, electrical traces 264f, and protective coating 266f.

Notwithstanding the foregoing, in the embodiment of FIG. 4F, the light assembly 260f may be at least partially positioned within (e.g., surrounded by) the tactile dome 232. In particular, the light assembly 260f may be positioned along a top surface of the first deformable layer 250f such that the light source 262f is aligned with a base 235 of the tactile dome 232. In some cases, as shown in FIG. 4F, the light source 262f is positioned within a recess 240 of the tactile dome 232. The recess 240 may be a groove or opening that extends partially or fully through the base 235 of the tactile dome 232. The recess 240 may be configured to receive the light source 262f such that the recess surrounds or conforms to a shape of the light source 262f.

The recess 240 may allow the tactile dome 232 to function as a light conduit or light pipe within the key assembly 208f. The tactile dome 232 may surround or partially surround the light source 262f such that light emitted from the light source 262f is directed into a light-transmissible (translucent) body of the tactile dome 232. For example, the light source 262f may emit light substantially along light path L4 which may extend into the tactile dome 232 at the base 235 and along or through the walls 239 of the tactile dome 232. In some cases, the walls 239 may include reflective or treated surfaces that may help retain light within the tactile dome 232 as the light travels toward a key cap positioned above the tactile dome 232. This may allow the tactile dome 232 to direct light received toward a specified portion of the key cap 210, for example, such as a light transmissible underside of the key cap associated with an illuminable symbol and/or prevent light leakage within the key assembly 208f. In some cases, the tactile dome 232 may direct light to the specified portion of the key cap depending on the particular shape or contour of the illuminable symbol and cause the light assembly 260f to illuminate the illuminable symbol according to a predetermined optical effect (e.g., such as maximizing a brightness of the illuminable symbol on the key cap).

Figure 4G:
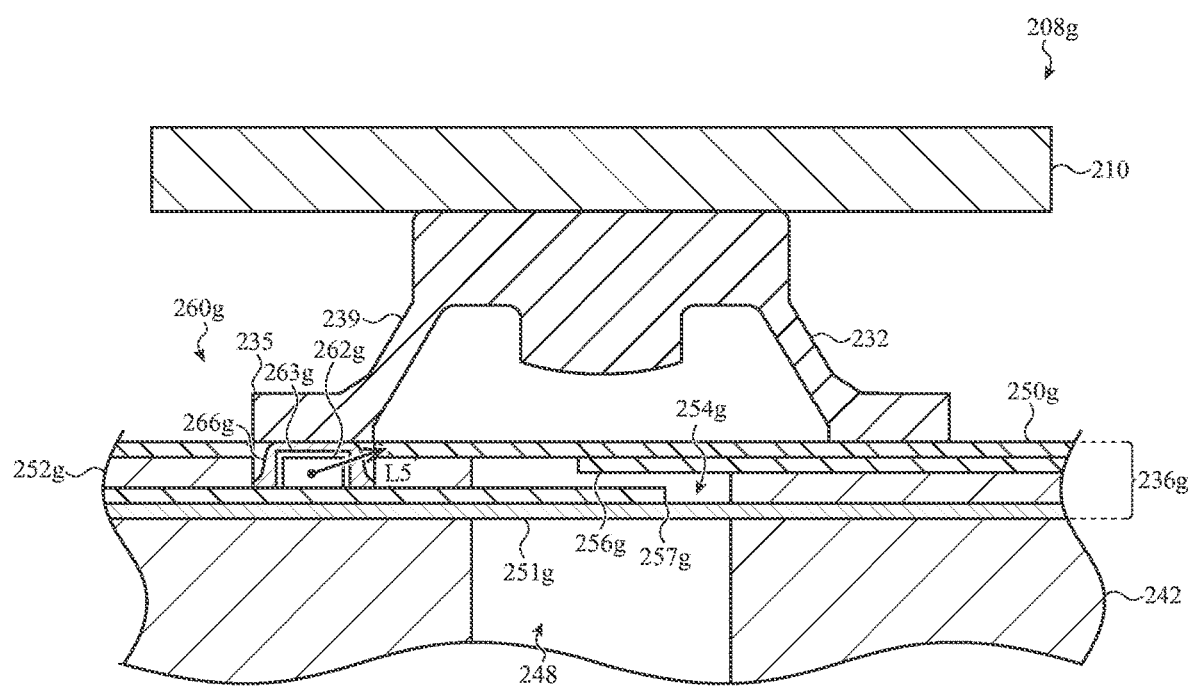
FIG. 4G depicts a cross-sectional view of another embodiment of a light integrated sensing membrane, take along line A-A of FIG. 1.

With reference to FIG. 4G, a cross-sectional view of the key assembly 208g is shown taken along line A-A of FIG. 1. As shown in FIG. 4G, the key assembly 208g includes a light integrated sensing membrane 236g. The light integrated sensing membrane 236g may be configured to operate in a manner substantially analogous to the light integrated sensing membrane 136 described with respect to FIGS. 1-3F. For example, the light integrated sensing membrane 236g may be configured to illuminate an illuminable symbol of the key assembly 208g and trigger a switch event. In particular, the light integrated sensing membrane 236g includes at least one deformable layer having electrical terminals for a contact-based key switch and electrical traces for a mLED or other appropriate light source. That is, the electrical terminals may electrically couple to one another to output a signal upon deformation of the at least one deformable layer. Accordingly, the light integrated sensing membrane 236g may include similar components as that of the light integrated sensing membrane 136, including a first deformable layer 250g, a second deformable layer 251g, a spacer layer 252g separating the deformable layers, a cavity 254g, a first electrical contact 256g, a second electrical contact 257g, light assembly 260g, light source 262g, optical layer 263g, and protective coating 266g.

Notwithstanding the foregoing, in the embodiment of FIG. 4G, the light assembly 260g may be positioned along a top surface of the second deformable layer 251g and extend into one or both of the spacer layer 252g and the first deformable layer 250g. In particular, the light assembly may be positioned along the second deformable layer 251g such that the light source 262g extends through an opening or through a portion of one or both of the spacer layer 252g and the first deformable layer 250g. The light source 262g shown in FIG. 3G may be a side firing mLED that is configured to direct light substantially along light path L5. The light path L5 may extend along a longitudinal direction of the light integrated sensing membrane 236g such that light from the light source 262g may propagate through the spacer layer 252g and/or the first deformable layer 250g. In this regard, the spacer layer 252g and/or the first deformable layer 250g may be used as a light guide (or otherwise define an optical path) to transfer or propagate light between various regions within the key assembly 208g, including propagating the light toward an illuminable symbol of the key cap 210.

Figure 4H:
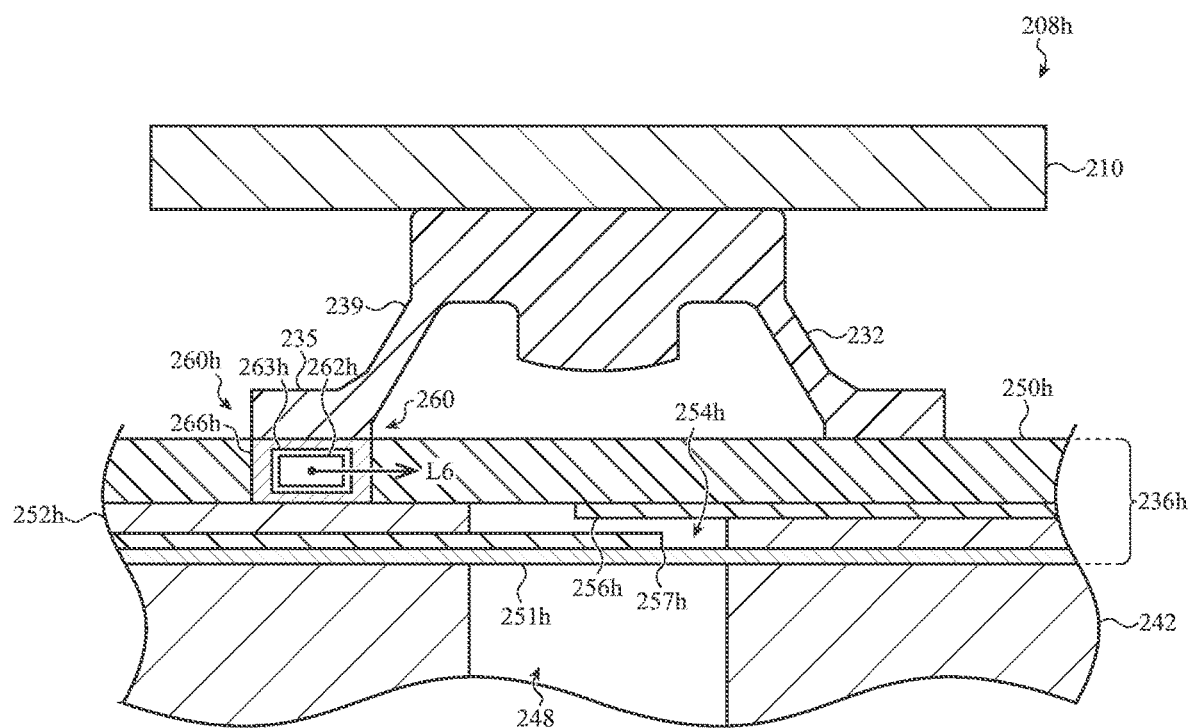
FIG. 4H depicts a cross-sectional view of another embodiment of a light integrated sensing membrane, take along line A-A of FIG. 1.

With reference to FIG. 4H, a cross-sectional view of the key assembly 208h is shown taken along line A-A of FIG. 1. As shown in FIG. 4H, the key assembly 208h includes a light integrated sensing membrane 236h. The light integrated sensing membrane 236h may be configured to operate in a manner substantially analogous to the light integrated sensing membrane 136 described with respect to FIGS. 1-3F. For example, the light integrated sensing membrane 236h may be configured to illuminate an illuminable symbol of the key assembly 208h and trigger a switch event. In particular, the light integrated sensing membrane 236h includes at least one deformable layer having electrical terminals for a contact-based key switch and electrical traces for a mLED or other appropriate light source. Accordingly, the light integrated sensing membrane 236h may include similar components as that of the light integrated sensing membrane 136, including a first deformable layer 250h, a second deformable layer 251h, a spacer layer 252h separating the deformable layers, a cavity 254h, a first electrical contact 256h, a second electrical contact 257h, light assembly 260h, light source 262h, optical layer 263h, electrical traces 264h, and protective coating 266h.

Notwithstanding the foregoing, in the embodiment of FIG. 4H, the light assembly 260h may be positioned at least partially within the first deformable layer 250h. In particular, the light assembly 260h may be arranged within a thickness of the first deformable layer 250h such that the light source 262h is positioned along a longitudinal direction of the first deformable layer 250h. In some cases, as shown in FIG. 4H, the light source 262h may be encapsulated or enclosed within the optical layer 263h and/or the protective coating 266h within the first deformable layer 250h. The light source 262h shown in FIG. 4H may be a side firing mLED that is configured to direct light substantially along light path L6. The light path L6 may extend along a longitudinal direction of the light integrated sensing membrane 236h such that light from the light source 262h may propagate through the first deformable layer 250h. In this regard, the first deformable layer 250h may be used as a light guide to transfer or propagate light between various regions within the key assembly 208h, including propagating the light toward an illuminable symbol of the key cap 210.

Figure 4I:
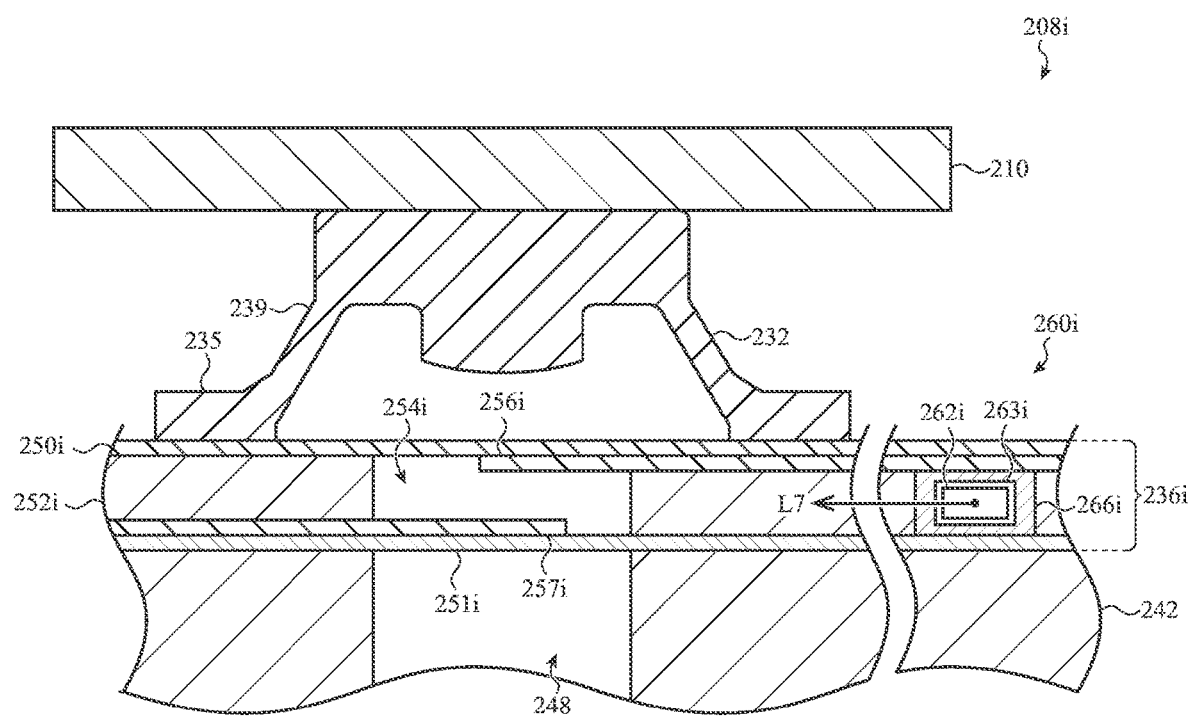
FIG. 4I depicts a cross-sectional view of another embodiment of a light integrated sensing membrane, taken along line A-A of FIG. 1.

With reference to FIG. 4I, a cross-sectional view of the key assembly 208i is shown taken along line A-A of FIG. 1. As shown in FIG. 4I, the key assembly 208i includes a light integrated sensing membrane 236i. The light integrated sensing membrane 236i may be configured to operate in a manner substantially analogous to the light integrated sensing membrane 136 described with respect to FIGS. 1-3F. For example, the light integrated sensing membrane 236i may be configured to illuminate an illuminable symbol of the key assembly 208i and trigger a switch event. In particular, the light integrated sensing membrane 236i includes at least one deformable layer having electrical terminals for a contact-based key switch and electrical traces for a mLED or other appropriate light source. Accordingly, the light integrated sensing membrane 236i may include similar components as that of the light integrated sensing membrane 136, including a first deformable layer 250i, a second deformable layer 251i, a spacer layer 252i, a cavity 254i, a first electrical contact 256i, a second electrical contact 257i, light assembly 260i, light source 262i, optical layer 263i, and protective coating 266i.

Notwithstanding the foregoing, in the embodiment of FIG. 4I, the light assembly 260i may be at least partially positioned within the spacer layer 252i. In particular, the light assembly 260i may be arranged within a thickness of the spacer layer 252i such that the light source is positioned along a longitudinal direction of the spacer layer 252i. In some cases, as shown in FIG. 4I, the light source 262i may be encapsulated or enclosed within the optical layer 263i and/or the protective coating 266i within the spacer layer 252i. The light source 262i shown in FIG. 4I may be a side firing mLED that is configured to direct light substantially along light path L7. This light path L7 may extend along a longitudinal direction of the light integrated sensing membrane 236i such that light from the light source 262i may propagate through the spacer layer 252i. In this regard, the spacer layer 252i may be used as a light guide to transfer or propagate light between various regions within the key assembly 208i, including propagating the light toward an illuminable symbol of the key cap 210.

Other examples and implementations are within the scope and spirit of the disclosure and appended claims. For example, features implementing functions may also be physically located at various positions, including being distributed such that portions of functions are implemented at different physical locations. Similarly, although embodiments have been discussed in the context of keys of a keyboard, other input mechanisms may incorporate or form embodiments described herein. As an example, trackpads, mice, buttons, touch-sensitive surfaces, and the like may all incorporate structures and/or methods of operation described herein. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A keyboard, comprising: a key cap;
a tactile dome below the key cap;
a first deformable layer positioned below the tactile dome;
a second deformable layer separated from the first deformable layer by a cavity; an electrical terminal of a key switch positioned on the first deformable layer; and a light assembly having a light source fully encapsulated between the second deformable layer and a protective coating and at least partially disposed below an upper surface of a feature plate;
wherein the tactile dome is configured to collapse and electrically couple the electrical terminal with an element of the keyboard.

2. The keyboard of claim 1, wherein:
the electrical terminal is a first electrical terminal of the key switch;
the element of the keyboard is a second electrical terminal of the key switch positioned on the second deformable layer;
the key cap defines an illuminable symbol; and
the light source illuminates the illuminable symbol by emitting light through one or more of the set of deformable layers.

3. The keyboard of claim 2, wherein:
the keyboard further comprises a spacer layer positioned between the first deformable layer and the second deformable layer and that defines the cavity;
the first electrical terminal is positioned within the cavity;
the second electrical terminal is positioned within the cavity; and
the first electrical terminal and the second electrical terminal are configured to physically contact one another upon collapse of the tactile dome, thereby triggering a switch event.

4. The keyboard of claim 1, wherein:
the key cap defines an illuminable symbol;
the tactile dome comprises a contact feature configured to move the electrical terminal when the tactile dome collapses; and
the contact feature is translucent and configured to direct light from the light source toward the illuminable symbol.

5. The keyboard of claim 1, wherein the first deformable layer defines a first surface and a second surface opposite the first surface, electrical traces are positioned on the first surface, and the electrical terminal is positioned on the second surface.

6. The keyboard of claim 1, wherein the light source is disposed at least partially below an upper surface of the feature plate disposed below the tactile dome.

7. The keyboard of claim 1, wherein the protective coating defines a light guide optically coupled with the light source and having at least one light extraction feature configured to direct light toward the key cap.

8. A keyboard, comprising: a key cap;
a tactile dome below the key cap;
a first deformable layer positioned below the tactile dome;
a key switch positioned on the first deformable layer and having an electrical terminal;
a second deformable layer separated from the first deformable layer by a cavity;
a feature plate disposed below the tactile dome; and
a light assembly having a light source, the light source being at least partially disposed within a relief cavity of the feature plate, the light assembly comprising a light extraction feature configured to propagate light toward the key cap;
wherein the light extraction feature comprises at least one of a textured surface, a lens, an aperture, or a translucent region; and
the light source is fully encapsulated between the second deformable layer and a protective coating.

9. The keyboard of claim 8, wherein the light source is coupled with electrical traces connected to the one of the set of the deformable layers.

10. The keyboard of claim 9, wherein the first deformable layer is configured to deform into the cavity in response to depression of the key cap, thereby causing the set of electrical terminals to initiate the switch event.

11. The keyboard of claim 9, wherein:
a spacer layer defines the cavity; and
the relief is at least partially aligned with the cavity.

12. The keyboard of claim 8, wherein:
the key cap includes an illuminable symbol; and
the light assembly is configured to propagate light toward the illuminable symbol during depression of the key cap.

13. The keyboard of claim 12, wherein the light assembly is configured to illuminate the illuminable symbol by propagating light along an optical path defined at least partially through one or more of the set of deformable layers or the spacer layer.

14. A keyboard, comprising: a key cap;
a tactile dome below the key cap; a deformable layer positioned below the tactile dome; a key switch positioned on the deformable layer;
a plate disposed below deformable layer, a cavity formed in the plate below the tactile dome; and
a light assembly having a light source, the light source being at least partially disposed below an upper surface of the plate, wherein the light source is fully encapsulated between the deformable layer and a protective coating.

15. The electronic device of claim 14, wherein, the tactile dome defines a base positioned on the deformable layer, and the base is a translucent portion of the tactile dome configured to receive light from the light source.

16. The electronic device of claim 15, wherein an electrical terminal of the key switch is positioned within the cavity.

17. The electronic device of claim 14, wherein the light source comprises micro light emitting diodes.

18. The electronic device of claim 14, wherein, the electronic device further comprises an optical sensor coupled with the electrical terminal and wherein the optical sensor is configured to detect buckling of the tactile dome using reflected light.

* * * * *